United States Patent
Loney et al.

(10) Patent No.: US 10,229,864 B1
(45) Date of Patent: Mar. 12, 2019

(54) CRYOGENIC INTEGRATED CIRCUIT HAVING A HEAT SINK COUPLED TO SEPARATE GROUND PLANES THROUGH DIFFERENTLY SIZED THERMAL VIAS

(71) Applicants: Patrick Loney, Fairview Park, OH (US); Robert Miles Young, Ellicott City, MD (US); Daniel Robert Queen, Kensington, MD (US); Aaron Ashley Hathaway, Baltimore, MD (US); John X. Przybysz, Severna Park, MD (US)

(72) Inventors: Patrick Loney, Fairview Park, OH (US); Robert Miles Young, Ellicott City, MD (US); Daniel Robert Queen, Kensington, MD (US); Aaron Ashley Hathaway, Baltimore, MD (US); John X. Przybysz, Severna Park, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/704,919

(22) Filed: Sep. 14, 2017

(51) Int. Cl.
*H05K 1/02* (2006.01)
*H01L 27/18* (2006.01)
(Continued)

(52) U.S. Cl.
CPC ...... *H01L 23/4334* (2013.01); *H01L 23/3677* (2013.01); *H01L 23/3736* (2013.01);
(Continued)

(58) Field of Classification Search
CPC ........... H01L 23/4334; H01L 23/49568; H01L 23/433; H01L 23/367–23/3677;
(Continued)

(56) References Cited

U.S. PATENT DOCUMENTS 4,554,567 A   11/1985   Jillie et al.
5,780,314 A   7/1998   Chan
(Continued)

FOREIGN PATENT DOCUMENTS

EP   0883178 A2   12/1998
WO   2011109595 A1   9/2011

OTHER PUBLICATIONS

International Search Report corresponding to International Application No. PCT/US2018/048590 dated Nov. 28, 2018.
(Continued)

*Primary Examiner* — Marc Anthony Armand
*Assistant Examiner* — Younes Boulghassoul
(74) *Attorney, Agent, or Firm* — Tarolli, Sundheim, Covell & Tummino LLP

(57) ABSTRACT

An integrated circuit is provided that comprises a thermal sink layer, a first ground plane associated with a first set of circuits that have a first operational temperature requirement, and a first thermally conductive via that couples the first ground plane to the thermal sink layer. The circuit further comprises a second ground plane associated with a second set of circuits that have a second operational temperature requirement that is higher than the first operational temperature requirement, and a second thermally conductive via that couples the second ground plane to the thermal sink layer, wherein the first thermally conductive via has a greater volume of thermal conductive material than the second thermally conductive via to remove heat from the first set of circuits with less gradient than the second set of circuits.

16 Claims, 4 Drawing Sheets

(51) Int. Cl.
*H01L 23/367* (2006.01)
*H01L 23/373* (2006.01)
*H01L 23/433* (2006.01)

(52) U.S. Cl.
CPC ............ *H01L 27/18* (2013.01); *H05K 1/0204* (2013.01); *H05K 1/0207* (2013.01)

(58) Field of Classification Search
CPC ............ H01L 23/3736; H01L 23/3735; H01L 23/49827; H01L 23/49888; H01L 21/4871; H01L 21/4875; H01L 21/4882; H01L 21/4885; H01L 21/4889; H01L 21/76891; H01L 2225/06548; H01L 2225/06541; H01L 2225/06544; H01L 27/18; H01L 39/2474; H01L 39/04–39/045; H01L 29/437; H05K 1/0204–1/021
See application file for complete search history.

(56) References Cited

U.S. PATENT DOCUMENTS

| | | | | |
|---|---|---|---|---|
| 6,058,013 | A * | 5/2000 | Christopher | H01L 23/3677 165/185 |
| 2005/0254215 | A1 | 11/2005 | Khbeis et al. | |
| 2009/0102580 | A1 | 4/2009 | Uchaykin | |
| 2011/0215457 | A1 * | 9/2011 | Park | H01L 23/3677 257/686 |
| 2011/0290537 | A1 * | 12/2011 | Nagase | H01L 23/3677 174/251 |
| 2013/0258595 | A1 | 10/2013 | Tuckerman | |
| 2014/0131847 | A1 * | 5/2014 | Yee | H05K 1/0209 257/675 |
| 2014/0175632 | A1 | 6/2014 | Tan et al. | |
| 2016/0071903 | A1 * | 3/2016 | Herr | H01L 39/22 505/170 |
| 2016/0088720 | A1 * | 3/2016 | Willis | H05K 1/0206 361/709 |
| 2017/0077069 | A1 * | 3/2017 | Danno | H01L 23/047 |
| 2018/0102470 | A1 * | 4/2018 | Das | H01L 39/025 |

OTHER PUBLICATIONS

International Search Report for Corresponding PCT/US2018/050921, dated Dec. 7, 2018.

Ramos, R.C. et al. (2001). "Design for Effective Thermalization of Junctions for Quantum Coherence," IEEE Transactions on Applied Superconductivity,IEEE Service Center, Los Alamitos, CA, US, vol. 11, No. 1, p. 398-1001, Mar. 2001. XP011141967, ISSN: 1051-8223, DOI: 10.1109/77.919517 section entitled "I. Introduction"; p. 998; section entitled "II. Quantum States and Decoherence in a Resistively Shunted Junction"; p. 998-p. 999; right column, 1st and 2nd paragraph; p. 999; section entitled "V. Design to Avoid Heating" pp. 1000-1001 figures 1, 2.

Wellstood, F.C. et al. (1989). "Hot Electron Effect in the dc SQUID", IEEE Transactions on Magnetics, vol. 25, No. 2, pp. 1001-1004, Jan. 1, 1989. Retrieved from the Internet: URL:https://ieeexplore.ieee.org/ielx1/29/3941/00092457.pdf?tp=8,arnumber=924578,isnumber=3041; Abstract; Section entitled "I. Introduction" p. 1001 left column; last paragraph-right column 1st paragraph; p. 1001 last paragraph of section entitled "Heating in Normal Metal Thin-Films"; p. 1003; section entitled "Results on SQUIDs"; pp. 1003-1004.

International Search Report and Written Opinion corresponding to International Application No. PCT/US2018/045184 dated Dec. 17, 2018.

* cited by examiner ived, and a second thermally conductive via that couples the second ground plane to the thermal sink layer. The first thermally conductive via has a greater volume of thermally conductive material than the second thermally conductive via. The greater volume of thermally conductive material allows the heat to be removed with less temperature gradient.

CRYOGENIC INTEGRATED CIRCUIT HAVING A HEAT SINK COUPLED TO SEPARATE GROUND PLANES THROUGH DIFFERENTLY SIZED THERMAL VIAS

GOVERNMENT INTEREST

The invention was made under Government Contract Number 30078128. Therefore, the US Government has rights to the invention as specified in that contract.

TECHNICAL FIELD

The present invention relates generally to integrated circuits, and more particularly to a multiple ground plane thermal sink.

BACKGROUND

Monolithic Microwave Integrated circuit (MMIC) chips operating at cryogenic temperatures have superconducting circuits that need to be thermally managed by removing the heat from the superconducting circuits down towards the substrate. Heat removal off the top side is inefficient due to superconducting solder bumps. This leads to unacceptably high temperature gradients. However, ground planes made of metal mesh material in lower level layers in the MMIC bring the entire layers to a thermal equilibrium. Because of this, portions of devices on the MMIC that need to be maintained at lower temperatures end up becoming exposed to higher temperature components. At the cryogenic conditions, heat load, cooling resources, temperature, and circuit complexity are strongly tied to each other. The savings of one unit of power dissipation is magnified by multiple orders of magnitude when lifting from cryogenic temperatures to room temperature. As cryogenic chips become more and more complex, a greater number and greater variation of devices are populating the MMICs. Each of these devices can have different operational temperature requirements.

A typical cryogenic MMIC consists of a silicon substrate topped with alternating layers of electrically conducting material and dielectric. Multiple device types can exist in the MMIC. As an example, a MMIC may have three different device types that need to run at three different operating temperatures. For example, a first device may need to operate below 500 mK, a second device may need to operate below 1 K, and a third device may need to operate below 4 K. With a single ground plane, the entire mesh layer will be at a near uniform temperature. This is due to the ability of the electrically conducting material to transport (spread) the heat laterally in the X and Y directions. Therefore, if all devices are connected to this ground plane, all will have to be maintained to the most stringent operating requirement, for example, 500 mK. That is since the third device only needs to be kept at 4 K, but is instead maintained at 0.5 K, then 8 times the cooling resources are needed to manage this sector of the MMIC.

SUMMARY

In one example, an integrated circuit is provided that comprises a thermal sink layer, a first ground plane associated with a first set of circuits that have a first operational temperature requirement, and a first thermally conductive via that couples the first ground plane to the thermal sink layer. The circuit further comprises a second ground plane associated with a second set of circuits that have a second operational temperature requirement that is higher than the first operational temperature requirement, and a second thermally conductive via that couples the second ground plane to the thermal sink layer. The first thermally conductive via has a greater volume of thermally conductive material than the second thermally conductive via. The greater volume of thermally conductive material allows the heat to be removed with less temperature gradient.

In yet another example, a monolithic microwave integrated circuit (MMIC) is provided that comprises a thermal sink layer underlying a substrate, a first electrically conducting ground plane associated with a first set of electrically conducting circuits that have a first operational temperature requirement, and a first set of thermally conductive vias that each couple the first electrically conducting ground plane to the thermal sink layer through the substrate. The circuit further comprises a second electrically conducting ground plane associated with a second set of electrically conducting circuits that have a second operational temperature requirement that is higher than the first operational temperature requirement, and a second set of thermally conductive vias that each couple the second ground plane to the thermal sink layer through the substrate, wherein the first set of thermally conductive vias have a greater volume of thermally conductive material than the second set of thermally conductive vias to remove heat with less gradient from the first set of superconducting circuits than the second set of superconducting circuits.

DETAILED DESCRIPTION

The present disclosure describes an integrated circuit (e.g., Monolithic Microwave Integrated circuit (MMIC)) that includes separate dedicated ground planes for sets of circuits that run at different operating temperature requirements. Each separate ground plane is coupled to a thermal sink layer at the bottom side of a substrate by respective thermal vias (contacts). The thermal sink layer can be cooled appropriately to allow for adequate heat sinking from each of the separate ground planes to maintain the respective sets of circuits at their desired operating temperature requirements. The thermal vias can be sized differently or have a different number of similarly sized thermal vias based on the different operating temperature requirements of ground planes and their associated circuitry to provide for adequate cooling of each ground plane. That is the volume of thermal conductive material of the thermal vias that couple a given ground plane to the thermal sink layer is greater than the volume of thermal conductive material of the thermal vias that couple a ground plane associated with circuits that have higher operating temperature requirements, and smaller than the volume of thermal conductive material of the thermal vias that couple a ground plane associated with circuits that have lower operating temperature requirements. This provides for proportional thermal sink capacity based on circuits having different operating temperature requirements.

The present examples will be illustrated with respect to electrically conducting ground planes and associated superconducting circuits with different operational temperature requirements. However, other examples can include mixture of electrically conducting ground planes and associated superconducting circuitry and non-superconducting ground planes and associated circuitry, or a mixture of non-superconducting circuitry and associated circuitry with different operational temperature requirements.

Figure 1:
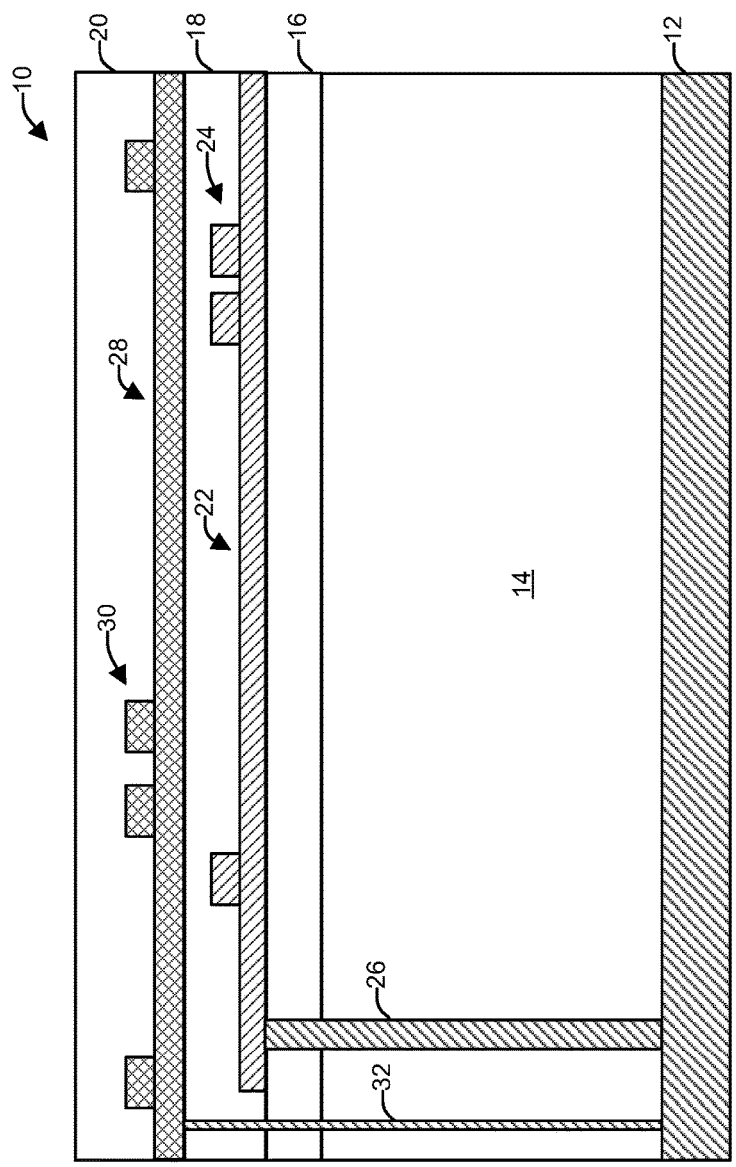
FIG. 1 illustrates a cross-sectional view of a portion of an example integrated circuit.

FIG. 1 illustrates cross-sectional view of portion of an example integrated circuit 10. The portion of the integrated circuit 10 includes a first dielectric layer 16 overlying a substrate 14, a second dielectric layer 18 overlying the first dielectric layer 16, and a third dielectric layer 20 overlying the second dielectric layer 18. The substrate 14 can be formed of silicon, glass or other substrate material. A thermal sink layer 12 resides at a bottom of the substrate 14. The first dielectric layer 16 provides a buffer layer between the substrate and the active circuits of the integrated circuit 10. A first electrically conducting ground plane 22 and a first set of superconducting circuits 24 are disposed in the second dielectric layer 18, and a second electrically conducting ground plane 28 and a second set of circuits 30 resides in the third dielectric layer 20. The first electrically conducting ground plane 22 and the first set of superconducting circuits 24 have a first operating temperature requirement and the second electrically conducting ground plane 28 and a second set of superconducting circuits 30 have a second operating temperature requirement.

The first operating temperature requirement is different and lower than the second operating temperature requirement, which makes the second operating temperature higher than the first operating temperature requirement. The term operating temperature requirement refers to an operating temperature that a circuit material of a ground plane and set of circuits needs to operate at or below to maintain their properties. For example, the first electrically conducting ground plane and a first set of superconducting circuits may include the utilization of Niobium, which needs to maintain an operating temperature of at or below 500 milliKelvin to superconduct, while the second electrically conducting ground plane and a second set of circuits may include the utilization of Aluminum, which needs to maintain an operating temperature of at or below 4 Kelvin to superconduct. That means a set of circuits with a lower operating temperature requirement needs more cooling resources and needs to sink more heat than a set of circuits with a higher operating temperature requirement.

A first thermal via 26 connects the first electrically conducting ground plane 22 to the thermal sink layer 12, and a second thermal via 32 connects the second electrically conducting ground plane 28 to the thermal sink layer 12 both through the substrate 12. The thermal sink layer 12 is formed of a thermal conductive material. A thermal conductive material is a material that is a relatively good thermal conductor, such that it readily transfers heat. A superconductive material is a good electrically conductive material but a poor thermal conductive material (compared to a normal metal that is not superconducting). Therefore, the thermal sink layer 12 is not formed of a superconductive material. Additionally, the first thermal via 26 and the second thermal via 32 can be formed of a thermal conductive material. That is a material that is relatively good at conducting heat from the electrically conducting ground layers to the thermal sink layer 12. The thermal sink layer 12 can be cooled by an external source. In one example, the thermal sink layer 12, the first thermal via 26 and the second thermal via 32 are all formed of copper. Alternative examples of thermally conductive materials include gold, silver, tungsten, molybdenum, iridium, and rhodium.

As illustrated in FIG. 1, the thickness and as a result the volume of thermally conductive material associated with the first thermal via 26 is greater than the thickness and as a result the volume of thermally conductive material associated with the second thermal via 32. Therefore, heat is removed from the first electrically conducting ground plane 22 and first set of superconducting circuits 24 with less gradient than present in the second electrically conducting ground plane 28 and the second set of superconducting circuits 30. This allows for providing a single cooling layer for cooling ground planes with different operating temperature requirements.

Therefore, the temperature of the first electrically conducting ground plane 22 and first set of superconducting circuits 24 can be maintained at a lower temperature than the second electrically conducting ground plane 28 and second set of superconducting circuits 30 by using the same thermal sink layer 12. The thermal sink layer 12 can be cooled to a temperature that can be higher than the first operating temperature requirement but still maintain the first electrically conducting ground plane 22 and the first set of superconducting circuits 24 at the first operating temperature requirement, and the second electrically conducting ground plane 28 and the second set of superconducting circuits 30 at the second operating temperature requirement.

Although FIG. 1 illustrates a single first thermal via 26 and a single second thermal via 32, there can be a greater number of first thermal vias and second thermal vias as long as the proportional volume of thermal conductive material of the first thermal vias relative to the second thermal vias are maintained to keep the temperature of the first electrically conducting ground plane 22 and the first set of superconducting circuits 24 at or below the first operating temperature requirement, and the second electrically conducting ground plane 28 and the second set of superconducting circuits 30 at or below the second operating temperature requirement.

Figure 2:
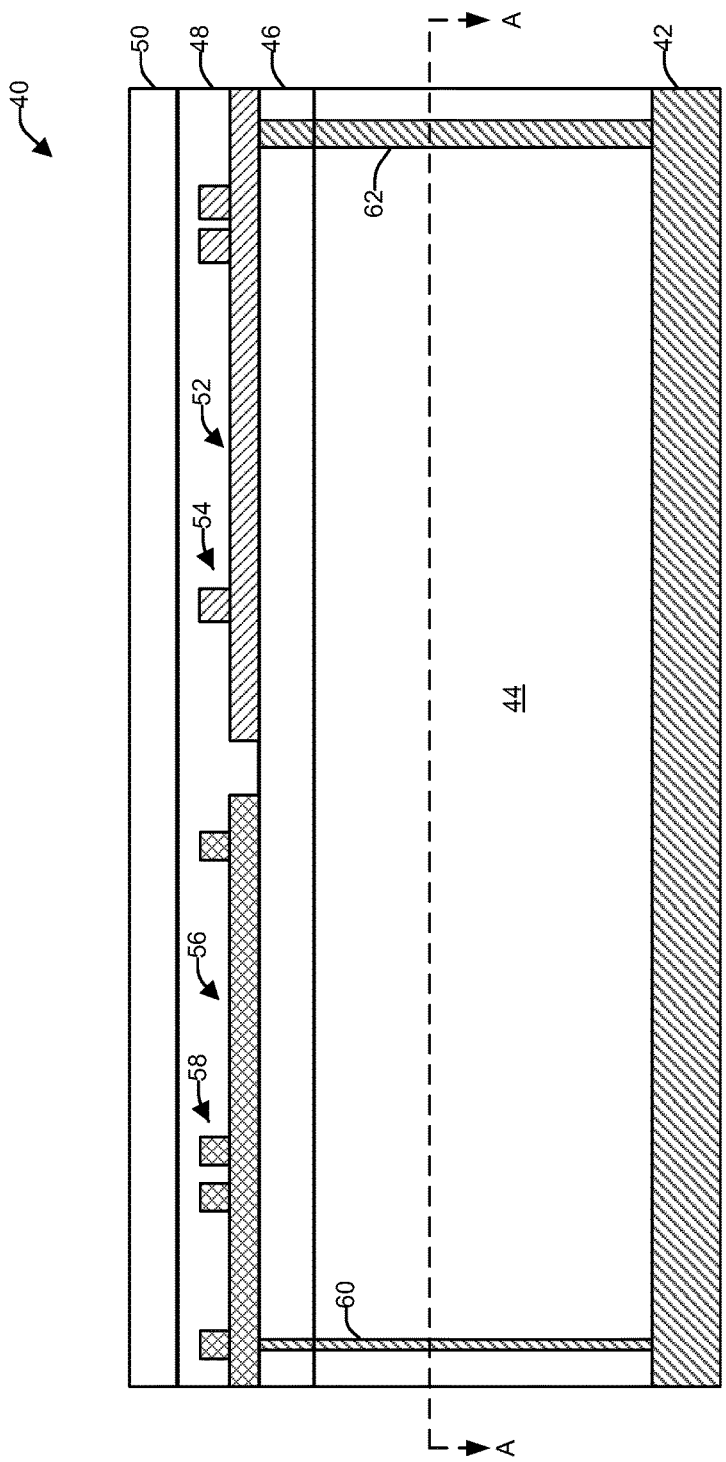
FIG. 2 illustrates a cross-sectional view of a portion of another example integrated circuit.

FIG. 2 illustrates cross-sectional view of portion of another example integrated circuit 40. The portion of the integrated circuit 40 includes a first dielectric layer 46 overlying a substrate 44, a second dielectric layer 48 overlying the first dielectric layer 46, and a third dielectric layer 50 overlying the second dielectric layer 48. The substrate 44 can be formed of silicon, glass or other substrate material. A thermal sink layer 42 resides at a bottom of the substrate 44. The first dielectric layer 46 provides a buffer layer between the substrate 44 and the active circuits of the integrated circuit 40. A first electrically conducting ground plane 52 and a first set of superconducting circuits 54 are disposed in the second dielectric layer 48, and a second electrically conducting ground plane 56 and a second set of circuits 58 are disposed in the second dielectric layer 48 in an adjacent relationship to first electrically conducting ground plane 52 and the first set of superconducting circuits 54. The first electrically conducting ground plane 52 and the first set of superconducting circuits 54 have a first operating temperature requirement and the second electrically conducting ground plane 56 and a second set of superconducting circuits 58 have a second operating temperature requirement.

In this example, the first operating temperature requirement is different and lower than the second operating temperature requirement, such that the second operating temperature requirement is higher than the first operating temperature requirement similar to the example in FIG. 1. The first electrically conducting ground plane 52 and the first set of superconducting circuits 54 may include the utilization of Niobium, which needs to maintain an operating temperature of at or below 500 milliKelvin to superconduct, while the second superconducting ground plane 56 and the second set of superconducting circuits 58 may include the utilization of Aluminum, which needs to maintain an operating temperature of at or below 4 Kelvin to superconduct.

A first set of thermal vias 62 connects the first electrically conducting ground plane 52 to the thermal sink layer 42, and a second set of thermal vias 60 connects the second electrcially conducting ground plane 60 to the thermal sink layer 42 both through the substrate 44. The thermal sink layer 42 is formed of a thermal conductive material. Additionally, the first set of thermal vias 62 and the second set of thermal vias 60 can be formed of a thermal conductive material. In one example, the thermal sink layer 44, the first set of thermal vias 62 and the second set of thermal vias 60 are all formed of copper.

Figure 3:
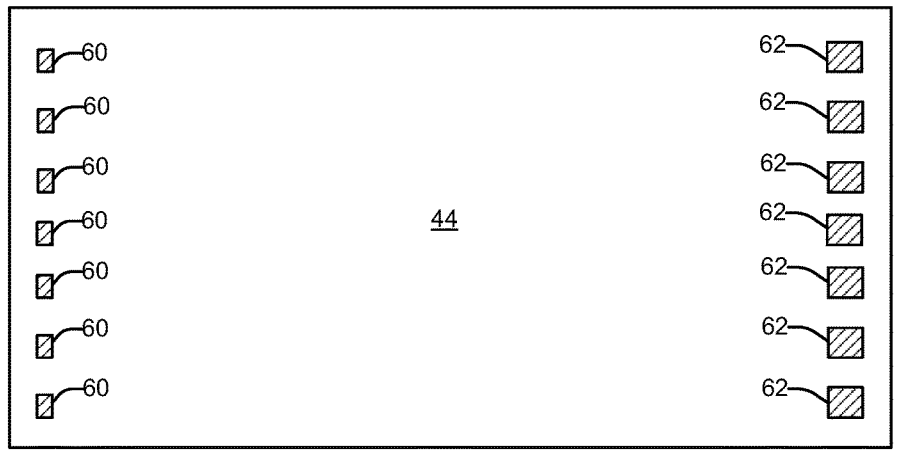
FIG. 3 illustrates a cross-sectional view of the portion of the integrated circuit along the lines A-A of FIG. 2.

FIG. 3 illustrates a cross-sectional view of the portion of the integrated circuit 40 along the lines A-A. As illustrated in FIG. 2-3, the thickness and as a result the volume of thermally conductive material associated with the first set of thermal vias 62 is greater than the thickness and as a result the volume of thermally conductive material associated with the second set of thermal vias 60. Therefore, the heat transferred and removed from the first electrically conducting ground plane 52 and the first set of superconducting circuits 54 is done with less gradient than the heat transferred and removed from second electrically conducting ground plane 56 and the second set of superconducting circuits 58.

The temperature of the first electrically conducting ground plane 52 and the first set of superconducting circuits 54 can be maintained at a lower temperature than the second electrically conducting ground plane 56 and the second set of superconducting circuits 58 by using the same thermal sink layer 42. The thermal sink layer 42 can be cooled to a temperature that can be higher than the first operating temperature requirement but still maintain the first electrically conducting ground plane 52 and the first set of superconducting circuits 54 at the first operating temperature requirement, and the second electrically conducting ground plane 56 and the second set of superconducting circuits 58 at the second operating temperature requirement.

Figure 4:
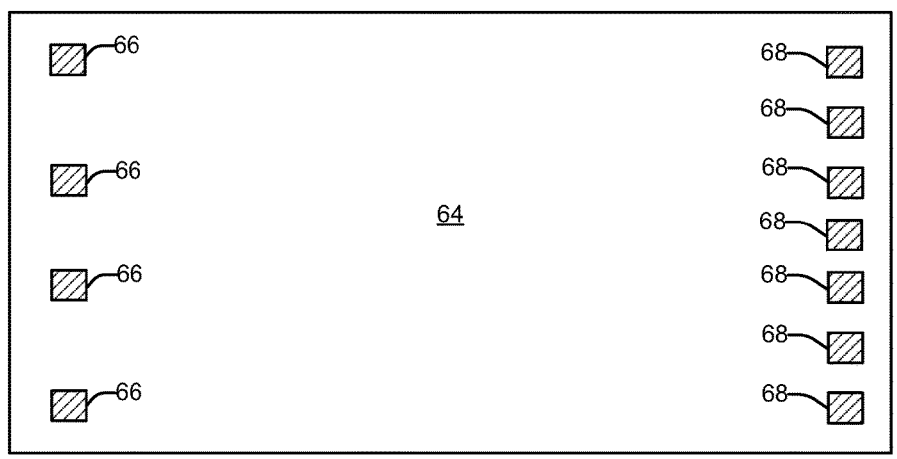
FIG. 4 illustrates an alternative possible example of a cross-sectional view of a portion of an integrated circuit that would be along the lines A-A of FIG. 2.

It is to be appreciated that in the example of FIG. 3 there is a one-to-one correspondence between vias in the first set of thermal vias 62 and the second set of thermal vias 60. FIG. 4 illustrates another example of a cross-sectional view of a portion of an integrated circuit. In this example, each of the thermal vias of a first set of thermal vias 68 and a second set of thermal vias 66 have substantially the same depth and width and as a result have substantially the same volume. However, the number of thermal vias in the first set of thermal vias 68 is greater than the number of thermal vias in the second set of thermal vias 66. As a result the volume of thermally conductive material in the first set of thermal vias 68 is greater than the volume of thermally conductive material in the second set of thermal vias 66. Therefore, greater cooling is provided to the first electrically conducting ground plane 52 and first set of superconducting circuits 54 relative to the second electrically conducting ground plane 56 and the second set of superconducting circuits 56. Due to the extra thermally conductive material in the first set of vias 68 the the complexity of the circuit is increased in this volume.

Figure 5:
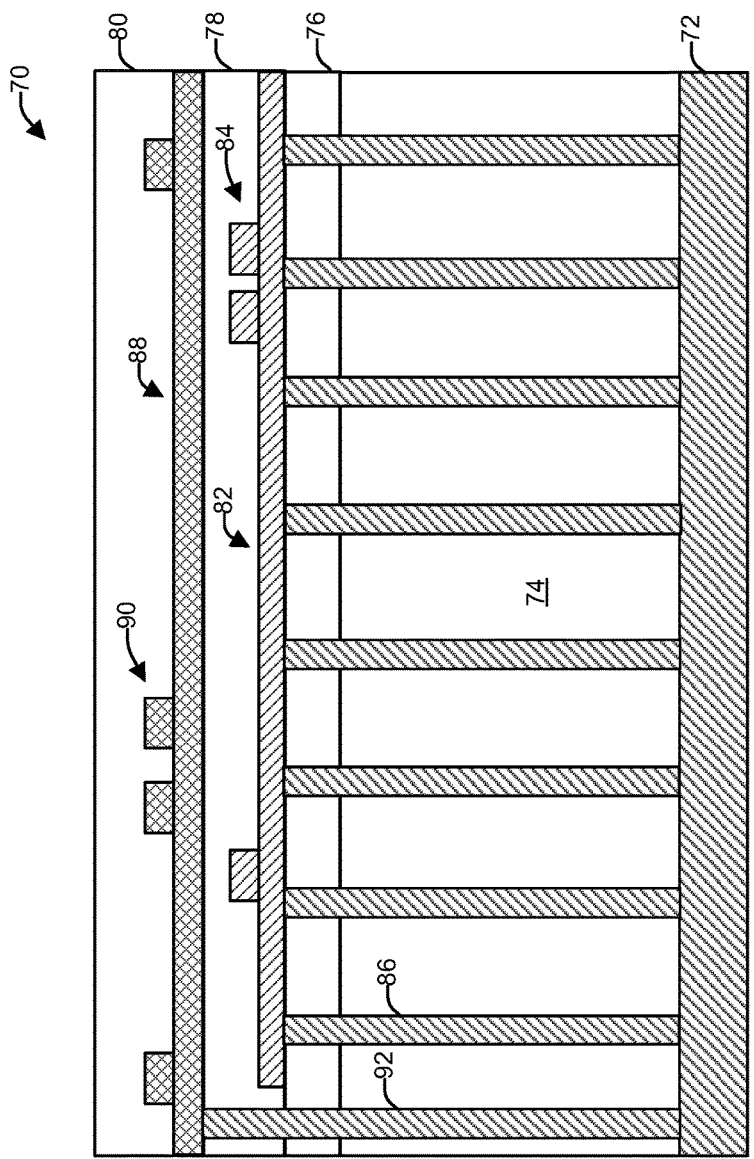
FIG. 5 illustrates a cross-sectional view of a portion of yet another example integrated circuit.

FIG. 5 illustrates a cross-sectional view of a portion of yet another example of an integrated circuit 70. The portion of the integrated circuit 70 includes a first dielectric layer 76 overlying a substrate 74, a second dielectric layer 78 overlying the first dielectric layer 76, and a third dielectric layer 80 overlying the second dielectric layer 78. The substrate 74 can be formed of silicon, glass or other substrate material. A thermal sink layer 72 resides at a bottom of the substrate 74. The first dielectric layer 76 provides a buffer layer between the substrate and the active circuits of the integrated circuit 70. A first electrically conducting ground plane 82 and a first set of superconducting circuits 84 are disposed in the second dielectric layer 78, and a second electrically conducting ground plane 88 and a second set of circuits 90 resides in the third dielectric layer 80. The first electrically conducting ground plane 82 and the first set of superconducting circuits 84 have a first operating temperature requirement and the second electrically conducting ground plane 88 and a second set of superconducting circuits 90 have a second operating temperature requirement.

A first set of thermals via 86 connect the first electrically conducting ground plane 82 to the thermal sink layer 72, and a second second set of thermal vias 92 connect the second electrically conducting ground plane 88 to the thermal sink layer 72 both through the substrate 74. The number of vias in the first set of thermal vias 86 is greater than the number of vias in the second set of thermal vias 92. The thermal sink layer 91 is formed of a thermally conductive material. The first set thermal vias 86 and the second set of thermal vias 92 can be formed of a thermally conductive material. That is a material that is relatively good at conducting heat from the electrically conducting ground layers to the thermal sink layer 72. The thermal sink layer 72 can be cooled by an external source. In one example, the thermal sink layer 72, the first set of thermal vias 86 and the second set of thermal vias 92 are all formed of copper. In this example, ground plane 88 has a larger gradient and requires fewer vias of a same similar size than ground plane 82 to maintain its higher operating temperature requirement. Ground plane 82 has a smaller gradient and requires more vias of a same similar size than ground plane 88 to maintain its lower operating temperature requirement.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An integrated circuit comprising:
   a thermal sink layer;
   a first ground plane associated with a first set of circuits that have a first operational temperature requirement;
   a first thermally conductive via that couples the first ground plane to the thermal sink layer;
   a second ground plane associated with a second set of circuits that have a second operational temperature requirement that is higher than the first operational temperature requirement; and
   a second thermally conductive via that couples the second ground plane to the thermal sink layer, wherein the first thermally conductive via has a greater volume of thermal conductive material than the second thermally conductive via to remove heat from the first set of circuits with less gradient than the second set of circuits.

2. The circuit of claim 1, wherein the thermal sink layer, the first thermally conductive via and the second thermally conductive via are formed of copper.

3. The circuit of claim 1, wherein the first ground plane and the first set of circuits are formed of a first electrically conducting material, and the second ground plane and the second set of circuits are formed of a second electrically conducting material that has a different operating temperature requirement than the first electrically conducting material.

4. The circuit of claim 3, wherein the first ground plane is formed from Niobium, and the second ground plane is formed of Aluminum.

5. The circuit of claim 3, wherein the first ground plane and the first set of circuits reside in a first dielectric layer overlying a substrate, and the second ground plane and the second set of circuits reside in a second dielectric layer overlying the substrate and one of overlying and underlying the first dielectric layer.

6. The circuit of claim 3, wherein the first ground plane and the first set of circuits reside in a first dielectric layer overlying a substrate, and the second ground plane and the second set of circuits reside in the first dielectric layer adjacent and physically separated from the first ground plane and the first set of circuits.

7. The circuit of claim 1, wherein the first thermally conductive via is one of a plurality of first thermally conductive vias that each couple the first ground plane to the thermal sink layer through a substrate, and the second thermally conductive via is one of a plurality of second thermally conductive vias that each couple the second ground plane to the thermal sink layer through the substrate.

8. The circuit of claim 7, wherein each of the first thermally conductive vias have a first size and each of the second thermally conductive vias have an equal number of thermally conductive vias of a second size, the first size being sized larger than the second size to remove a greater amount of heat from the first set of circuits than the second set of circuits.

9. The circuit of claim 7, wherein each of the first thermally conductive vias and each of the second thermally conductive vias are substantially the same size, wherein the number of the plurality of first thermally conductive vias is greater than the number of the plurality of second thermally conductive vias to remove heat from the first set of circuits with less gradient than the second set of circuits.

10. A monolithic microwave integrated circuit (MMIC) comprising:
a thermal sink layer underlying a substrate;
a first electrically conducting ground plane associated with a first set of superconducting circuits that have a first operational temperature requirement;
a first set of thermally conductive vias that each couple the first electrically conducting ground plane to the thermal sink layer through the substrate;
a second electrically conducting ground plane associated with a second set of superconducting circuits that have a second operational temperature requirement that is higher than the first operational temperature requirement;
a second set of thermally conductive vias that each couple the second ground plane to the thermal sink layer through the substrate, wherein the first set of thermally conductive vias have a greater volume of thermal conductive material than the second set of thermally conductive vias to remove a greater amount of heat from the first set of superconducting circuits than the second set of superconducting circuits.

11. The circuit of claim 10, wherein the thermal sink layer, the first thermally conductive via and the second thermally conductive via are formed of copper.

12. The circuit of claim 10, wherein the first electrically conducting ground plane is formed from Niobium, and the second electrically conducting ground plane is formed of Aluminum.

13. The circuit of claim 10, wherein the first electrically conducting ground plane and the first set of superconducting circuits reside in a first dielectric layer overlying the substrate, and the second electrically conducting ground plane and the second set of superconducting circuits reside in a second dielectric layer overlying the substrate and one of overlying and underlying the first dielectric layer.

14. The circuit of claim 10, wherein the first electrically conducting ground plane and the first set of superconducting circuits reside in a first dielectric layer overlying the substrate, and the second electrically conducting ground plane and the second set of superconducting circuits reside in the first dielectric layer adjacent and physically separated from the first ground plane and the first set of superconducting circuits.

15. The circuit of claim 10, wherein each thermally conductive via of the first set of thermally conductive vias have a first size and each thermally conductive via of the second set of thermally conductive vias have an equal number of thermally conductive vias of a second size, the first size being sized larger than the second size to remove heat from the first set of superconducting circuits with less gradient than the second set of superconducting circuits.

16. The circuit of claim 10, wherein each thermally conductive via of the first set of thermally conductive vias and each thermally conductive via of the second set of thermally conductive vias are substantially the same size, wherein the number of the thermally conductive vias of the first set of thermally conductive vias is greater than the number of the thermally conductive vias of the second set of second thermally conductive vias to remove heat from the first set of electrically conducting circuits with less gradient than the second set of superconducting circuits.

* * * * *